United States Patent
Beernink et al.

(10) Patent No.: US 7,638,353 B2
(45) Date of Patent: Dec. 29, 2009

(54) METHOD FOR FABRICATION OF SEMICONDUCTOR DEVICES ON LIGHTWEIGHT SUBSTRATES

(75) Inventors: Kevin Beernink, Clarkston, MI (US); Ginger Pietka, Harrison Township, MI (US); Timothy Barnard, Rochester Hills, MI (US)

(73) Assignee: United Solar Ovonic LLC, Auburn Hills, MI (US)

( * ) Notice: Subject to any disclaimer, the term of this patent is extended or adjusted under 35 U.S.C. 154(b) by 0 days.

(21) Appl. No.: 12/131,963

(22) Filed: Jun. 3, 2008

(65) Prior Publication Data

US 2009/0298217 A1  Dec. 3, 2009

(51) Int. Cl.
*H01L 21/00* (2006.01)
(52) U.S. Cl. .......................................... 438/57; 438/19
(58) Field of Classification Search .................. 438/19, 438/57; 136/206, 239, 243
See application file for complete search history.

(56) References Cited

U.S. PATENT DOCUMENTS

| 5,296,043 | A | 3/1994 | Kawakami et al. |
| 5,569,332 | A | 10/1996 | Glatfelter et al. |
| 6,468,828 | B1 * | 10/2002 | Glatfelter et al. ............. 438/80 |
| 6,500,295 | B1 * | 12/2002 | Kubota ....................... 156/269 |
| 6,767,762 | B2 | 7/2004 | Guha |
| 7,176,543 | B2 | 2/2007 | Beernink |
| 7,342,171 | B2 * | 3/2008 | Khouri et al. ............... 136/245 |

* cited by examiner

*Primary Examiner*—Matthew Smith
*Assistant Examiner*—Christine Enad
(74) *Attorney, Agent, or Firm*—Gifford, Krass, Sprinkle, Anderson & Citkowski, P.C.

(57) ABSTRACT

A method for making a semiconductor device having front-surface electrical terminals in which the device is manufactured so as to include a bottom electrode, a top electrode and a semiconductor body therebetween. A first bus bar is disposed in a groove in the semiconductor body. It is in electrical communication with the bottom electrode, and includes a tab portion which projects from the device. A second bus bar is in electrical communication with the top electrode, and is disposed atop the first electrode, and electrically insulated therefrom. The tab of the first bus bar provides one terminal of the device and is folded onto the second bus bar and is electrically insulated therefrom. The second bus bar provides the second terminal of the device.

25 Claims, 6 Drawing Sheets

METHOD FOR FABRICATION OF SEMICONDUCTOR DEVICES ON LIGHTWEIGHT SUBSTRATES

STATEMENT OF GOVERNMENT INTEREST

This invention was made, at least in part, under U.S. Government Contract Number F29601-03-C0122.

FIELD OF THE INVENTION

This invention relates generally to thin film semiconductor devices. More specifically, the invention relates to thin film semiconductor devices which are fabricated on thin, flexible substrates. In particular, the invention relates to lightweight, thin film photovoltaic devices fabricated upon thin, polymeric substrates.

BACKGROUND OF THE INVENTION

Overall device weight is often a significant factor with regard to semiconductor devices used in specialized applications such as aerospace applications, military applications, or other applications where portability of the device is important. Overall device weight is particularly important with regard to large area devices such as photovoltaic devices. Hence, there are significant incentives for the fabrication of large area, lightweight photovoltaic and other semiconductor devices.

Thin film semiconductor materials are frequently used for the preparation of lightweight photovoltaic devices since they are flexible, light in weight, and can be readily deposited over large areas by high speed, efficient deposition processes. In a typical thin film semiconductor device, the substrate, which supports the layers, is the major component of the weight of the device. In those instances where weight is not significant, substrates of glass, ceramic or metal may be employed. However, for lightweight and ultra lightweight applications thin substrates, typically fabricated for polymeric materials or metal foils, are preferred.

The use of thin, lightweight substrates can complicate processes for the fabrication of photovoltaic devices, particularly when those devices are being fabricated in a large volume, high speed process. Therefore, thin, lightweight substrates are frequently used in combination with a relatively thicker support member which is subsequently removed after device fabrication is completed.

In most instances, it is desirable that the positive and negative contact terminals for a photovoltaic device both be located so as to simplify its installation and use. In that regard, it is desirable that the device have electrical connection points that occupy different positions along a cross section of the device. The affixation of current collecting structures such as grid members, bus bars and terminals to a photovoltaic device can be complicated in those instances where a support member is employed. As will be explained hereinbelow, the present invention provides methods and device structures whereby lightweight photovoltaic devices may be fabricated on a thin substrate member, and wherein the devices are configured to have same surface terminals. These and other advantages of the invention will be apparent from the drawings, discussion and description which follow.

SUMMARY OF THE INVENTION

Disclosed herein is a method for making a photovoltaic device. According to the method, a substrate is provided, and that substrate may be disposed upon a support body. A layer of an electrically conductive bottom electrode material is disposed on the substrate so as to form a bottom electrode; a photovoltaic body is deposited in electrical communication with the bottom electrode; a layer of top electrode material is deposited in electrical communication with a photovoltaic body so as to form a top electrode. In the foregoing construction the bottom electrode, top electrode and photovoltaic body cooperate to provide a photovoltaic cell. In a further step, a portion of the top electrode and photovoltaic body are removed so as to form an opening therethrough having a portion of the bottom electrode exposed therein. An electrically conductive bus bar having a tab portion defined thereupon is affixed to the material so that the bus bar is in electrical communication with the exposed portion of the bottom electrode and so that the tab portion is free. A body of electrically insulating material is disposed so as to cover the first bus bar. A plurality of grid members are disposed in electrical communication with the top electrode, said grid members extending onto the insulating body. A second, electrically conductive bus bar is disposed upon the insulating body in electrical communication with the grid members so that the second bus bar establishes electrical communication with the top electrode. The tab portion provides a terminal of the device, and in some instances, the tab is folded into a superposed relationship with the second bus bar, and a portion of an electrically insulating material is disposed between the folded-over tab portion and the second bus bar so as to prevent electrical contact therebetween. In some instances, the portion of electrically insulating material may comprise a contiguous segment of the body of insulating material disposed at the top of the first bus bar in the previous step, or, in other instances, it may comprise a separate insulating body.

In particular instances, further steps may be implemented wherein a layer of protective material is disposed on the top electrode and/or wherein at least a portion of the support material is removed from the substrate.

The support material may comprise a body of metal and it may be removed by etching. In other instances, the support material may comprise a polymeric material and may be removed by etching, cutting, skiving or the like. The substrate of the device may comprise a body of polymeric material which in particular instances may comprise a polyimide. In specific instances, the photovoltaic body includes at least one layer of a group IV semiconductor alloy material, and such material may comprise a hydrogenated silicon, germanium, or silicon germanium alloy material. In particular instances, the photovoltaic body is configured to include at least one triad of layers comprised of a substantially intrinsic body of semiconductor material interposed between oppositely doped layers of semiconductor material. In some instances, the device may include a plurality of such triads stacked in an optical and electrical series relationship.

DETAILED DESCRIPTION OF THE INVENTION

The present invention is directed to lightweight semiconductor devices fabricated upon thin substrates. The semiconductor devices may comprise photovoltaic devices, and for purposes of illustration, this invention will be explained with reference to one particular process for the fabrication of lightweight and ultra lightweight, thin film photovoltaic devices; however, it is to be understood that the principles disclosed herein may be otherwise implemented and/or used for the fabrication of other thin film semiconductor devices such as photosensors, photoreceptors, and the like as well as for non-photoresponsive devices such as integrated circuits, device arrays, displays and the like.

Figure 1:
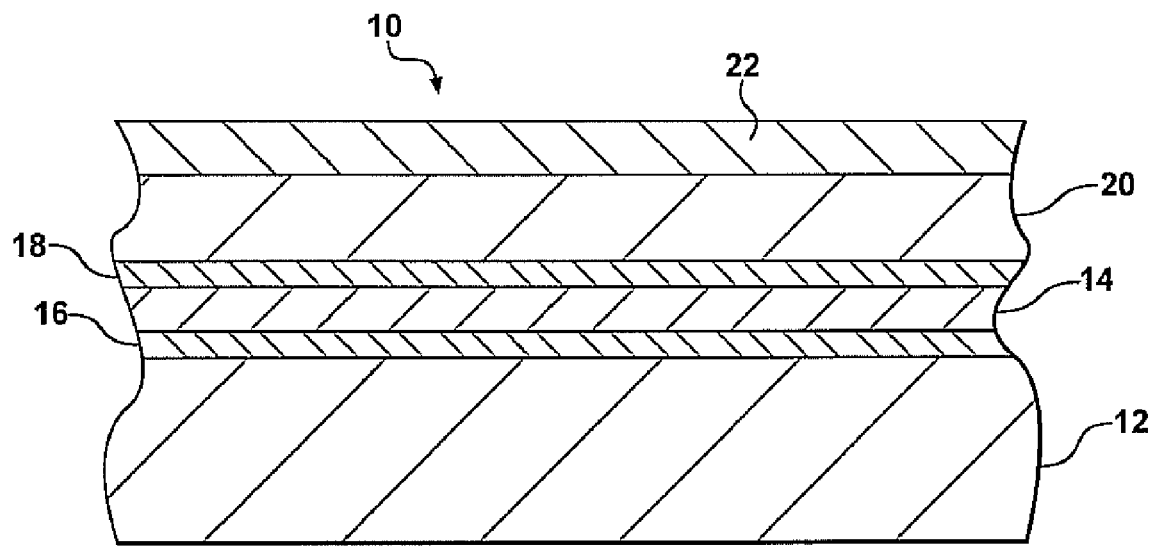
FIG. 1 is a cross-sectional view of a portion of a body of photovoltaic material of the type which may be used in the present process.

Referring now to FIG. 1, there is shown a cross-sectional view of a body of photovoltaic material 10, prepared for use in a process for the fabrication of a lightweight photovoltaic device. The photovoltaic material 10 includes a body of support material 12 which operates to retain all of the superjacent layers during various stages of the processing steps. As such, the support body 12 is relatively thick and has good dimensional stability. One specific material which may be utilized as the support body, in this embodiment, comprises stainless steel of approximately 5 mils thickness. Substrates of this type provide a good combination of tensile strength, flexibility, and dimensional stability which are compatible with high speed roll-to-roll processing techniques. Other substrate materials may comprise polymeric materials as well as rigid materials such as glass, ceramics, thicker metal bodies and the like, in those instances where flexibility is not required.

A body of substrate material 14 is retained upon the support member 12. The substrate material 14 is typically a thin, lightweight material, and one specific substrate material comprises a thin, high strength polymer having good thermal stability. Typical thicknesses are in the range of 0.5 to 2.0 ml. Such polymers include polyimides such as the material sold under the designation Kapton® by the DuPont Corporation. And, in one particular instance, the substrate comprises a polyimide layer of 1 mil thickness. In some instances, the substrate may comprise a metallic body. In any instance, the substrate 14 is affixed to the support, as for example by adhesive lamination, thermal lamination, or the like.

In the illustrated embodiment, a layer of stress relief material 16 is interposed between the support member 12 and substrate 14. This layer 16 will remain affixed to the substrate 14 in the completed device and operates to balance stresses imposed on the substrate by superjacent layers of the device. Such layers as well as methods for their fabrication and use are disclosed in U.S. Pat. No. 7,176,543, and the disclosure hereof is incorporated herein by reference. It is to be understood that this layer is optional; and furthermore, other layers of material may be readily incorporated between the substrate 14 and support 12 in a similar manner.

Disposed atop the substrate 14 is a layer of a bottom electrode material 18. The material of this layer is electrically conductive, and will form the base electrode of the photovoltaic device. This layer should have good electrical conductivity and is typically fabricated from a metal, although other materials such as polymers, metal oxides and the like having sufficient electrical conductivity may also be employed. In those instances where the photovoltaic device is illuminated from its top surface, this bottom electrode layer may also be made from a highly reflective material so as to function as a back reflector operative to direct unabsorbed light back through the subjacent photovoltaic material. The bottom electrode layer 18 may be a composite body fabricated from a plurality of layers of different materials chosen to combine optimum electrical and optical properties. In one instance, the bottom electrode layer comprises a highly reflective layer of silver having an optical tuning layer of a transparent, electrically conductive material such as zinc oxide thereatop. As is known in the art, this combination of layers may be chosen so as to optimize both electrical conductivity and absorption of light by superjacent semiconductor layers. Such composite back reflectors are shown, for example, in U.S. Pat. Nos. 5,296,043 and 5,569,332, both of which are incorporated herein by reference.

A photovoltaic body 20 is disposed atop the bottom electrode 18. This photovoltaic body 20 is operative to absorb incident photons and generate carrier pairs in response thereto. There are a variety of photovoltaic materials and configurations which may be utilized to fabricate the photovoltaic body 20. One specific group of materials comprises group IV semiconductor materials, which specifically include hydrogenated alloys of silicon and/or germanium. In particular, these materials may be configured to form one or more triads wherein each triad comprises a layer of substantially intrinsic semiconductor material interposed between oppositely doped layers of semiconductor material. In a triad of this type, carrier pairs generated in the substantially intrinsic layer of semiconductor material are separated by an internal field generated by the respective doped layers, so as to create a photovoltaic current. The triads may be stacked in an optical and electrical series relationship to produce a multijunction device as is known in the art. While the invention is being described with reference to one particular class of photovoltaic devices and materials, it is to be understood that the principles of the invention may be implemented in connection with any photovoltaic device and material.

Disposed atop the photovoltaic body 20 is a layer of top electrode material 22. In those instances where the photovoltaic device is to be illuminated through the top surface, this top electrode material 22 is preferably transparent, and as such may comprise a transparent electrically conductive oxide material such as indium tin oxide (ITO) as is known in the art. Other such transparent, electrically conductive materials may likewise be employed, and the invention is not limited to any specific top electrode material. It is to be noted that in the FIG. 1 illustration, the photovoltaic body 20 is shown as being in direct electrical contact with the bottom electrode layer 18 and top electrode layer 22; however, in some device configurations, intermediate layers such as current buffering layers, matching layers, and the like may be included; hence, while the photovoltaic body 20 is in electrical communication with the electrode layers 18 and 22, direct electrical contact is not required. In the operation of the device, the photovoltaic body 20, top electrode layer 22 and bottom electrode layer 18 cooperate to provide a photovoltaic cell in which absorption of light in the photovoltaic body 20 creates and separates carrier pairs which are collected by the electrode layers.

Figure 2:
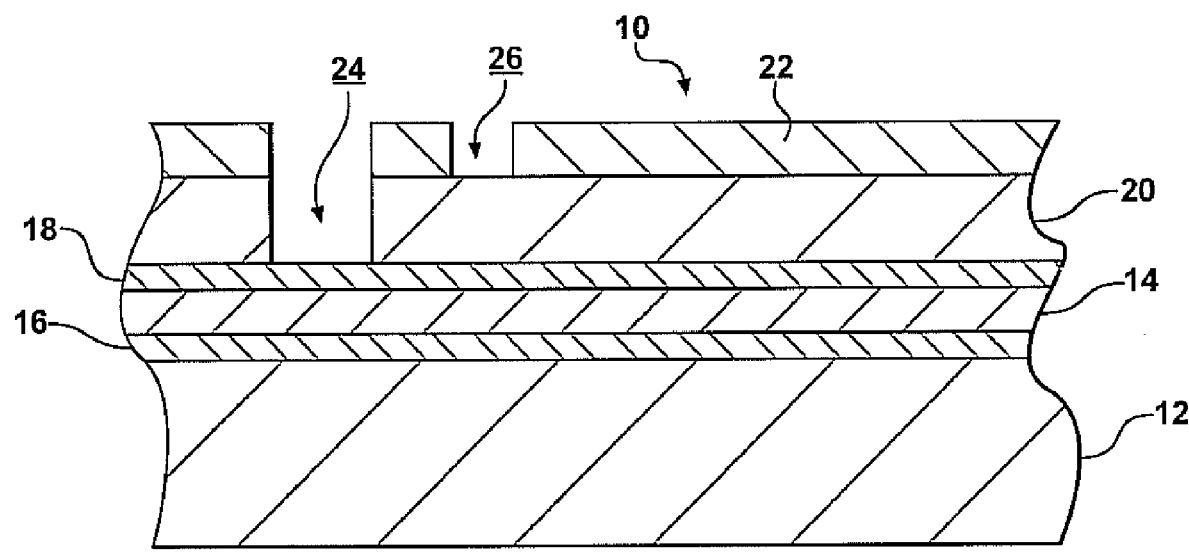
FIG. 2 is a cross-sectional view of the body of photovoltaic material of FIG. 1 at a first stage in the process.

The material of FIG. 1 may be prepared in large areas by high volume techniques such as roll-to-roll methods. For subsequent processing, the material is typically cut into smaller size areas corresponding to finished cells or modules. Referring now to FIG. 2, there is shown the material 10 of FIG. 1 at a first stage in its processing. In this stage, a first groove 24 is formed in the material 10 so as to extend through the top electrode layer 22 and photovoltaic body 20. This groove 24 exposes a portion of the bottom electrode 18 at its base. The groove may be formed by a variety of techniques, and one specific technique which may be utilized comprises chemical etching. This etching may be implemented, in the case of semiconductor devices comprised of a top electrode layer of indium tin oxide or the like and a semiconductor body of hydrogenated silicon and/or germanium layers, by the use of a product commercially available under the designation SolarEtch Si from Merck KGaA.

As will be seen in FIG. 2, a second groove 26 is etched into the device. This groove 26 extends only through the first electrode layer and serves to form a perimeter around a photovoltaically active area of the device. This groove limits lateral conductivity in the finished device and thus serves to electrically isolate portions of the photovoltaic cell bounded thereby.

Figure 3:
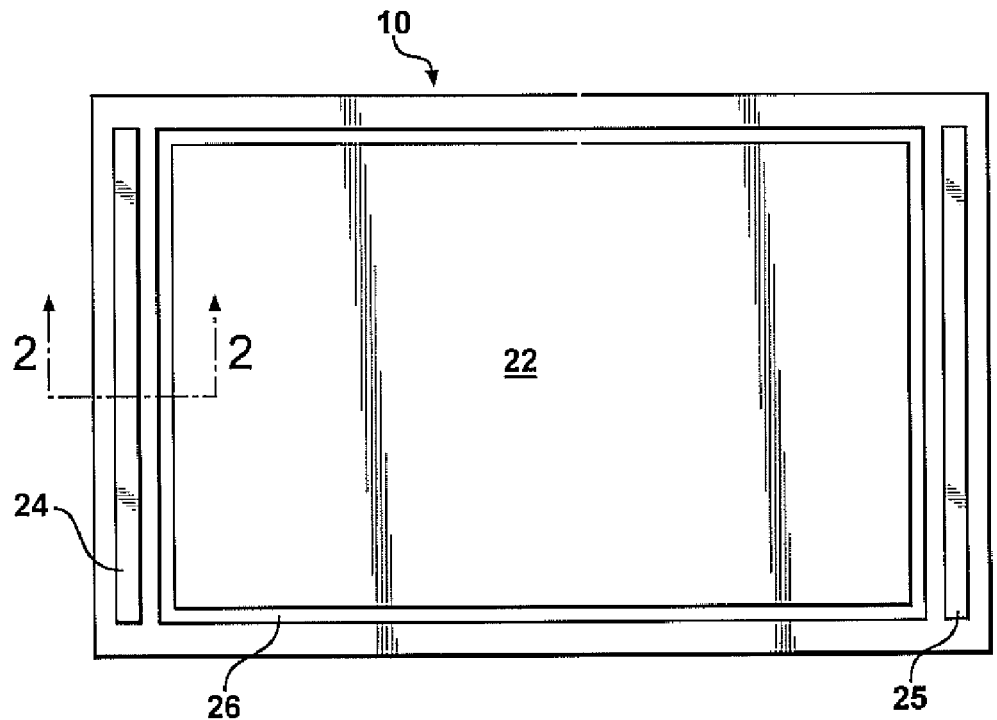
FIG. 3 is a top plan view of the photovoltaic material of FIG. 2.

Referring now to FIG. 3, there is shown a top plan view of a body of photovoltaic material which is being configured into a thin film photovoltaic device in accord with the present invention. The material 10 is of the type shown in FIGS. 1 and 2, and FIG. 2 is a cross-sectional view thereof taken along line 2-2. As will be seen from FIG. 3, the second groove 26 bounds a perimeter of the active area which is covered by a portion of the top electrode material 22, while the first groove 24 extends along one edge of the body of material 10 outside of the bounded perimeter. It will also be seen that a third groove 25, generally similar to the first groove 24, is disposed on the opposite side of the perimeter.

Figure 4:
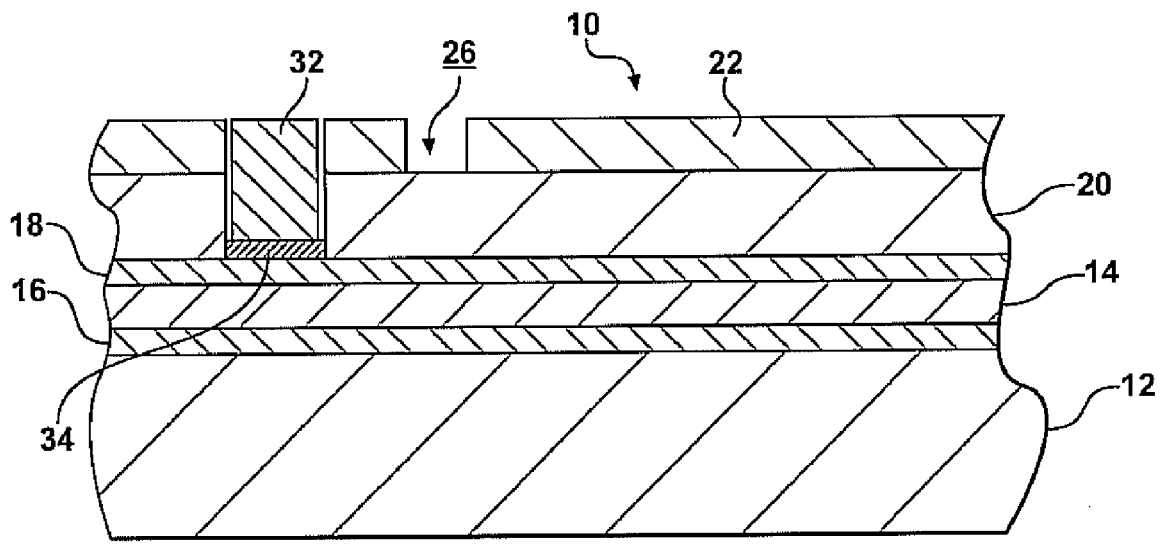
FIG. 4 is a cross-sectional view of the body of photovoltaic material at a further stage in the processing wherein a first bus bar has been affixed.
Figure 5:
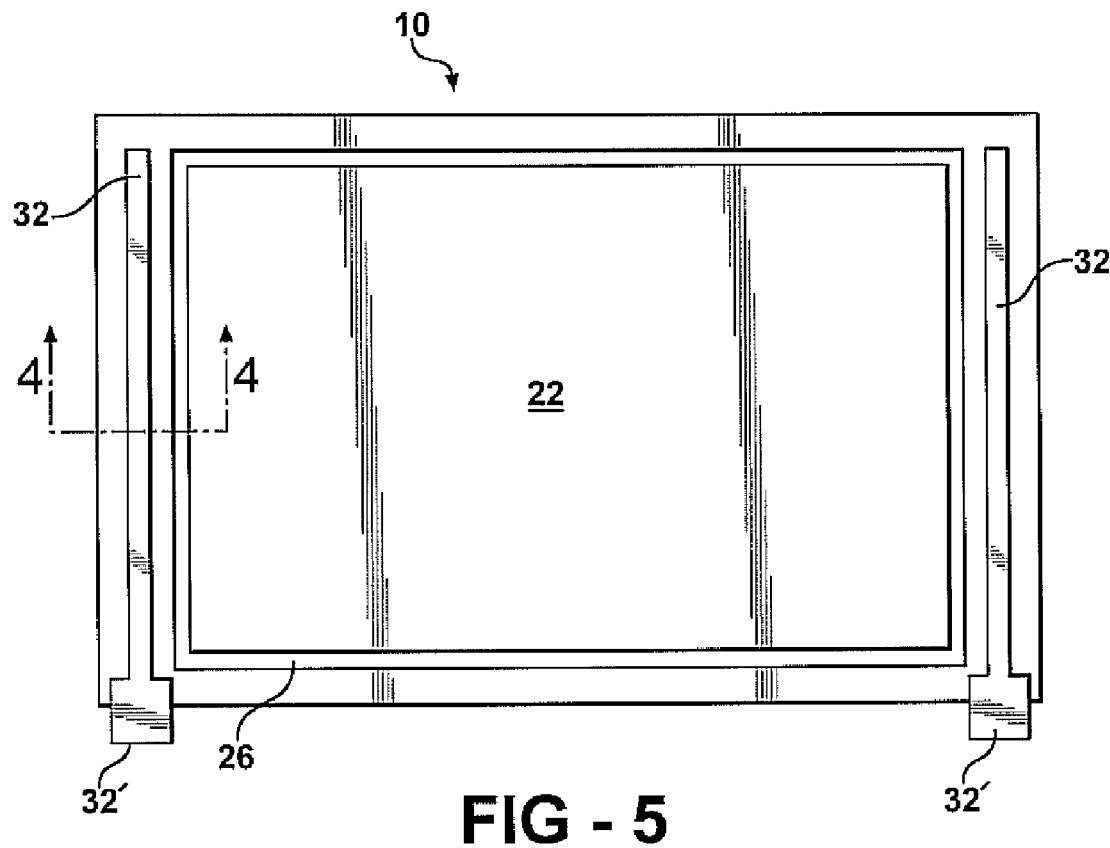
FIG. 5 is a top plan view of the photovoltaic material of FIG. 4.

Referring now to FIGS. 4 and 5, there are shown further stages in the processing of the device. FIG. 4 is a cross-sectional view of the material 10 taken along line 4-4 of FIG. 5. As will be seen in FIG. 4, a first bus bar 32 is disposed in the first groove 24. This bus bar 32 is in electrical contact with the bottom electrode 18, in this instance via a body of electrically conductive adhesive 34. In other embodiments, the bus bar 32 may be affixed to the bottom electrode 18 by welds or the like. The bus bar 32 is fabricated from a material having good electrical conductivity, and one such material comprises a copper ribbon having a silver coating thereupon. While the first bus bar 32 is shown as being entirely within the groove 24, it may likewise be disposed only partially in the groove, or it may be disposed separate from the groove provided that it establishes electrical communication with the bottom electrode material 18. It should also be noted that another first bus bar is likewise disposed in the third groove 25 of the device, as illustrated in FIG. 3. It should also be noted that for purposes of illustration, the relative thicknesses of the semiconductor layers and electrode layers have been greatly exaggerated. In most actual implementations, these layers will be very thin compared to the thickness of the bus bar, substrate and support.

FIG. 5 is a top plan view of the body of material 10 at this stage of the processing. What is to be noted from FIG. 5 is that the bus bar 32 includes a tab portion 32' which projects therefrom and extends beyond the perimeter of the active area of the device as defined by the etched groove 26.

Figure 6:
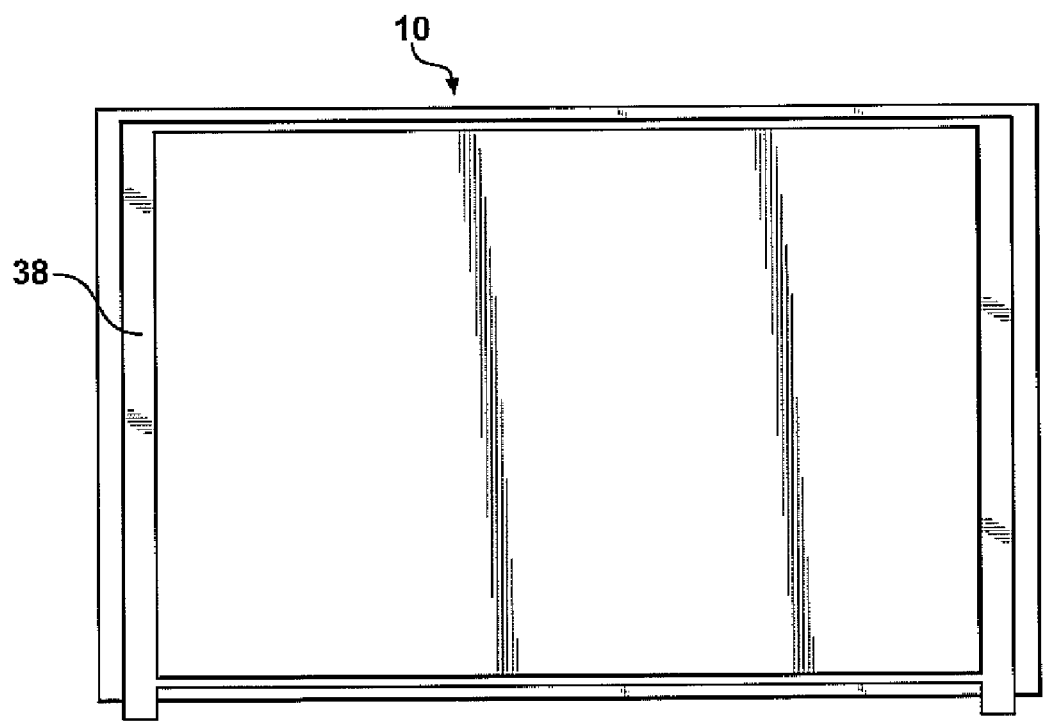
FIG. 6 is a top plan view of the photovoltaic material of FIG. 5 at a subsequent step in its processing wherein an insulating material has been affixed.

In a subsequent step of the process, a body of an electrically insulating material is disposed atop the first bus bar 32. Referring now to FIG. 6, there is shown a top plan view of the photovoltaic material 10 having an insulating tape 38 disposed atop the first bus bar. As will be seen, the tape 38 also covers the tab portion of the bus bar in this particular implementation of the invention. The insulating material may be adhesively affixed to the bus bar, and in particular instances, a body of double-sided adhesive tape may be utilized as the insulating body. However, in other instances, single-sided adhesive tape may be likewise employed as may be other insulating bodies which can be otherwise affixed to the bus bar.

Figure 7:
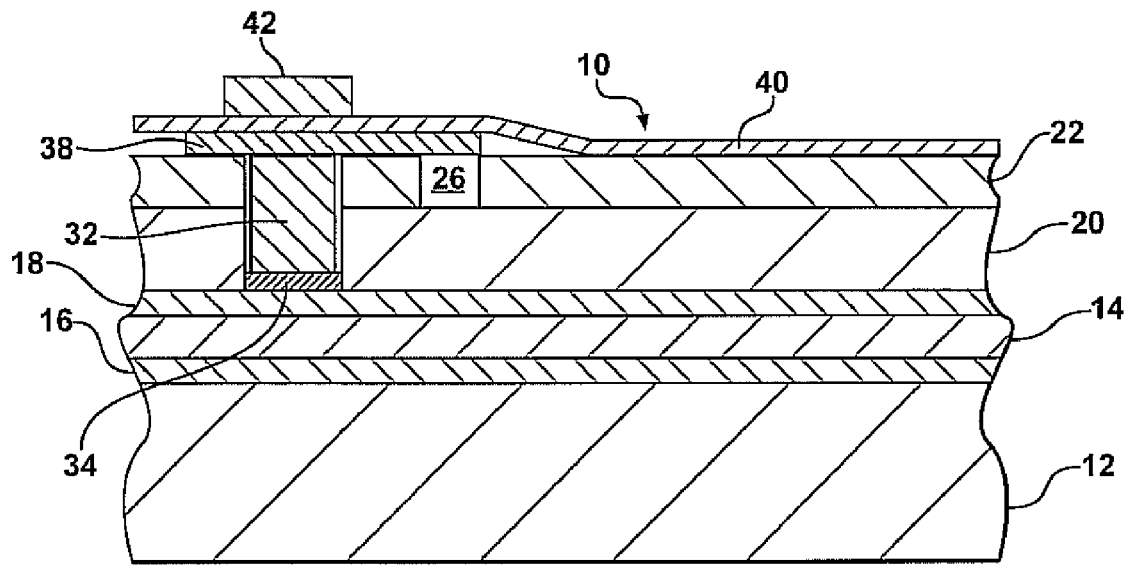
FIG. 7 is a cross-sectional view of the photovoltaic material at a further step in its processing wherein grid wires and a second bus bar have been affixed.

In subsequent steps, grid wires and a second bus bar are affixed to the device. Referring now to FIG. 7, there is shown a cross-sectional view of the photovoltaic material 10 with the insulating tape 38 affixed over the first bus bar 32. As will be seen, the insulating tape 38 extends beyond the periphery of the bus bar 32 and abuts the perimeter of the active area of the device as defined by the second groove 26 in the top electrode 22. As further shown in FIG. 7, a grid wire 40 extends across the surface of the top electrode 22, and this grid wire 40 is carried up and onto the insulating body 38. The grid wire 40 is one of a number of grid wires which are typically disposed across the active area of the photovoltaic device. These wires serve to carry photogenerated electrical current from the top electrode. Typically, the grid wires are fabricated from a material having good electrical conductivity, and one particular material utilized in the present invention comprises a core of copper wire coated with a layer of silver and having a further coating on the outer surface of an electrically conductive, curable adhesive.

In the FIG. 7 embodiment, a second bus bar 42 is disposed upon the insulating tape 38, in electrical contact with the grid wire 40. This second bus bar serves to establish electrical communication with the top electrode 22 via the grid wires 40. In those instances where the adhesive used to attach the grid wires 40 and/or the adhesive associated with the insulating body 38 is a curable adhesive, the method involves the further step of curing that adhesive so as to accomplish the bonding of the elements of the device. In some embodiments, the adhesive utilized is a contact adhesive, and the curing step is thus not necessary.

Figure 8:
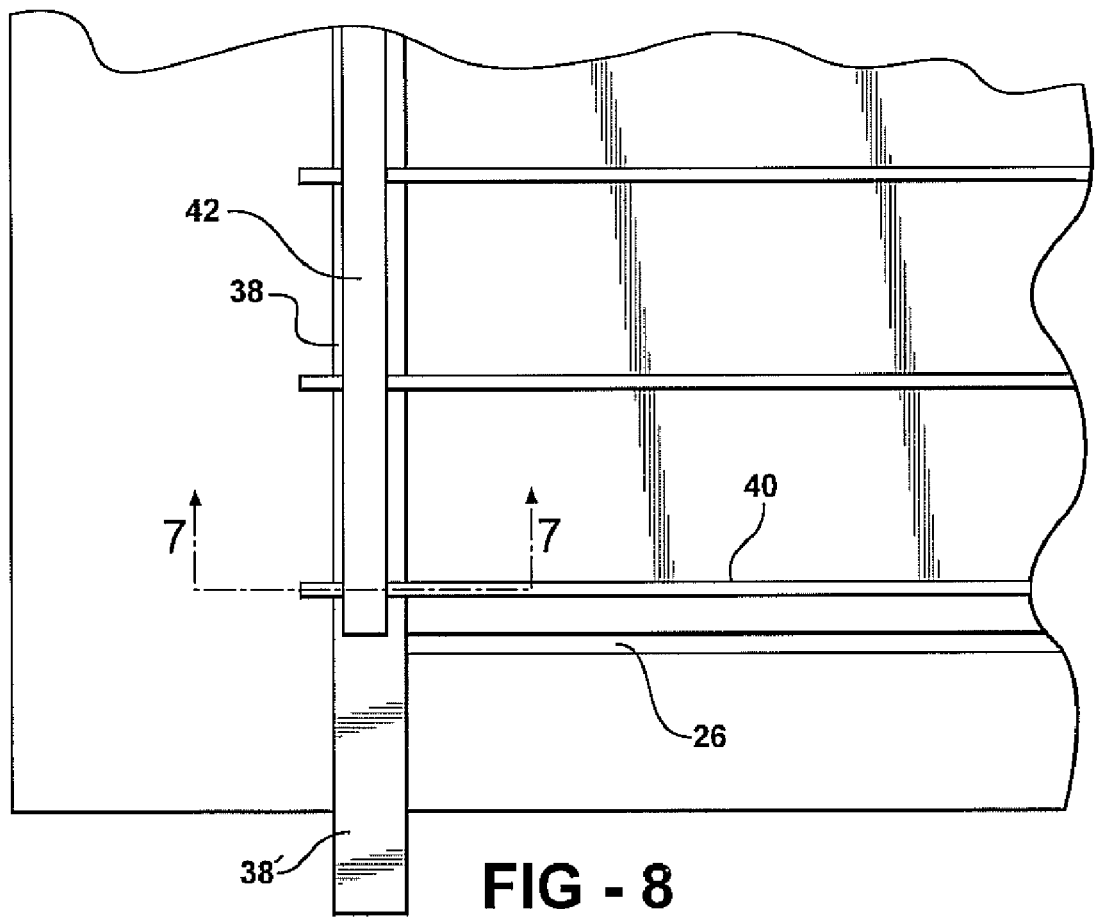
FIG. 8 is a view of the photovoltaic material of FIG. 7.

FIG. 8 is a top plan view of a portion of the photovoltaic device corresponding to FIG. 7 (wherein FIG. 7 is a cross-sectional view taken along line 7-7 of FIG. 8). FIG. 8 shows the relationship of the insulating tape 38, second bus bar 42, and grid wires 40. As will be seen, the insulating tape 38 has a tab portion 38' projecting therefrom.

Figure 9:
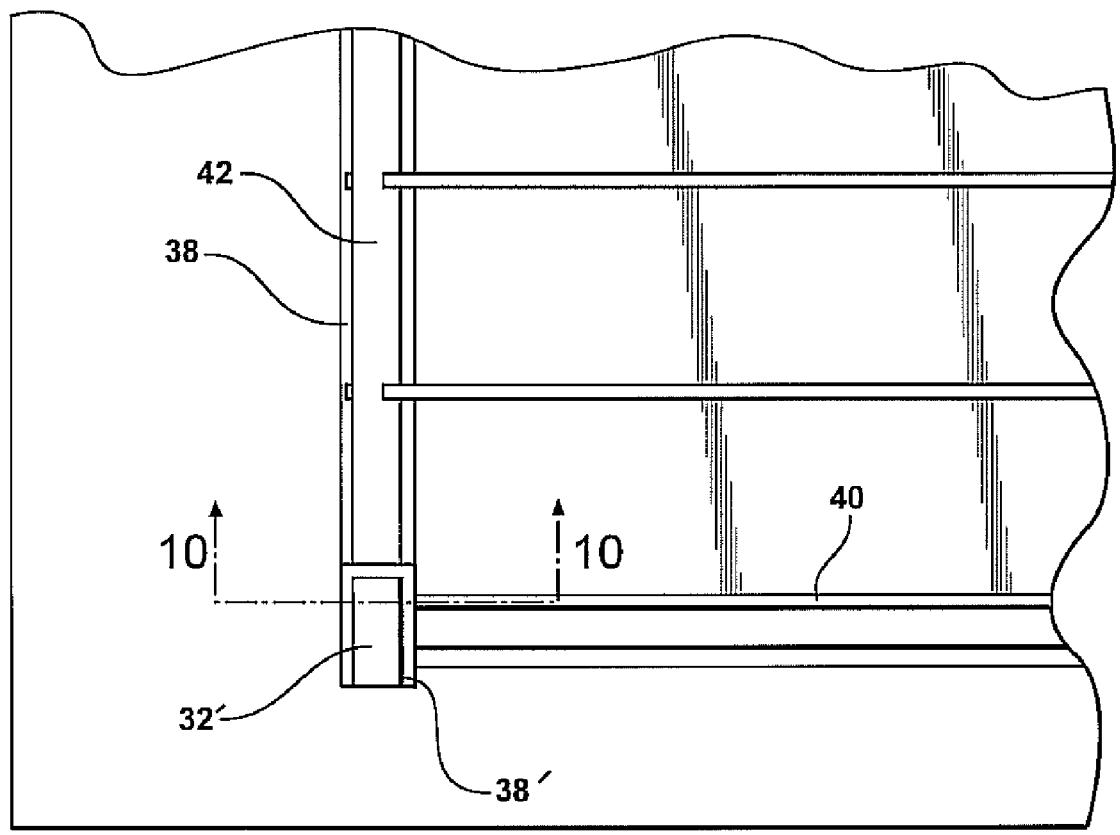
FIG. 9 is a top plan view of the photovoltaic material at yet a further step in its processing.
Figure 10:
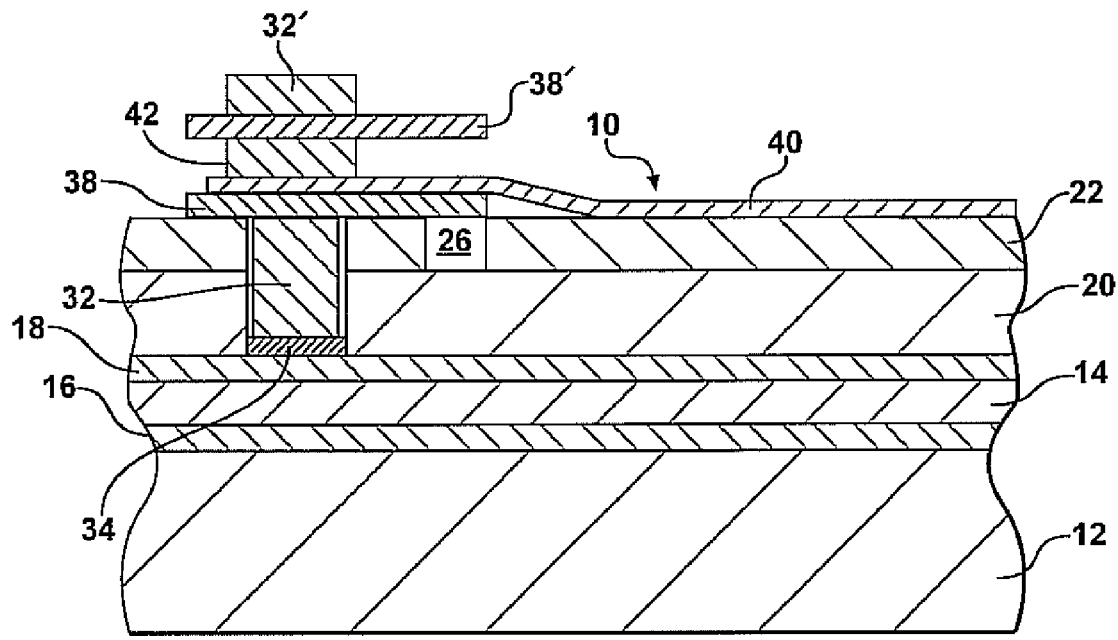
FIG. 10 is a cross-sectional view of the photovoltaic material of FIG. 9.

FIGS. 9 and 10 show a subsequent step in the fabrication of the device. FIG. 9 is a top plan view of a segment of the device corresponding generally to FIG. 8. As is shown in FIG. 9, the excess length of the grid wires 40 projecting beyond the second bus bar 42 is trimmed away, and the tab portion 32' of the first bus bar 32, together with its associated tab portion of the insulating tape 38', is folded over and onto the second bus bar 42 and remaining portion of the tape 38. This provides a front surface contact which is in electrical communication with the bottom electrode. FIG. 10 is a cross-sectional view of the portion of the device of FIG. 9 taken along line 10-10. As will be seen, the folded-over tab portion 32' of the first bus bar provides an electrical contact in communication with the bottom electrode 18, and this tab portion 32' is separated from the second bus bar 42 by the tab portion of insulating material 38'. This insulating material separating the tab 32' and second bus bar 42 need not be formed by a portion of the insulating tape. As will be apparent to those of skill in the art, a separate or additional portion of insulating material may be interposed appropriately. While in this particular process the tab portion 32' is folded over onto the second bus bar so as to provide a contact terminal, in other instances the tab 32' may be left to project free of the remainder of the device so that electrical contact can be made thereto. Likewise, a projecting portion of the second bus bar may be used as a terminal.

Figure 11:
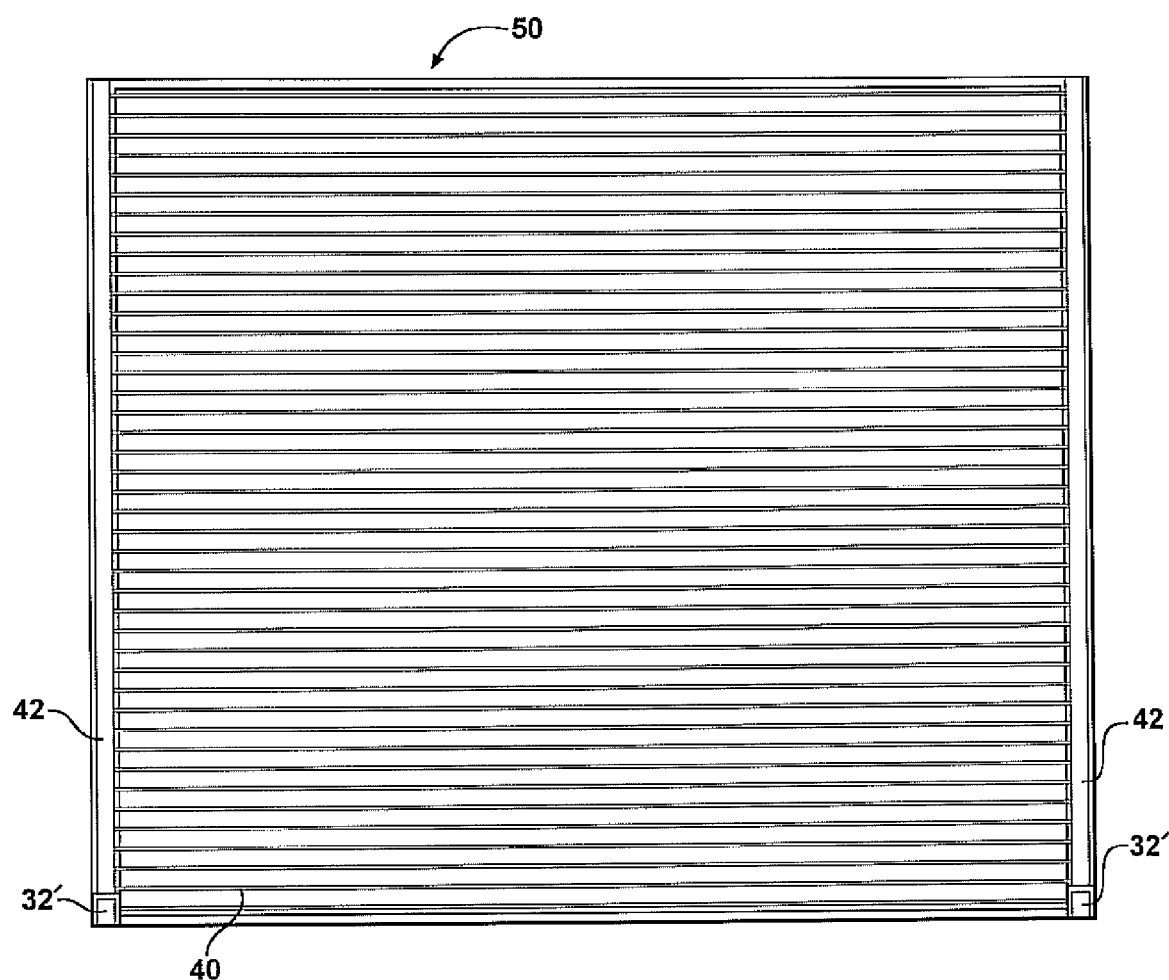
FIG. 11 is a top plan view of a finished photovoltaic device made in accord with the method.

Referring now to FIG. 11, there is shown a top view of a photovoltaic device 50 fabricated in accord with the foregoing general procedure. The device 50 includes a photovoltaically active area having a plurality of grid wires, such as grid wire 40, as described above, extending across the top electrode surface thereof. This device is configured, as previously described, so that tab portions 32' of a first bus bar are exposed on the upper surface of the device 50 where they function as a first set of electrical terminals. In a typical embodiment in which the photovoltaic device includes a photovoltaically active body of silicon material, these terminals 32' will be the negative terminal of the device. The exposed portions of the second bus bars 42 function as the second set of terminals, and in this instance they are positive terminals. It should be noted that in otherwise configured photovoltaic devices, the polarity of the terminals may be reversed.

It is also to be noted that in the FIG. 11 embodiment, the device 50 includes two negative terminals 32' and two positive terminals 42. In other configurations, the device may readily be configured to include a larger or smaller number of terminals. For example, a device may include only one terminal of each polarity, while in other instances it may include more than two terminals of each polarity. All of such embodiments are within the scope of this invention.

Generally, it is preferable that the top surface of the thus produced photovoltaic device is provided with a durable, protective layer, and this regard a front protective layer of a transparent material is spray coated onto the device so as to cover the bus bar structure, grid wires, and top surface of the photovoltaic device. Materials and techniques for preparing the front protective layer are well known in the art and other techniques such as lamination may also be used. Provision is made for electrical communication with the tab 32' and second bus bar 42.

While the device may be used in the as-made form, as discussed above, a particular advantage of the techniques disclosed herein is that they may be utilized for the fabrication of lightweight and ultra lightweight devices. In that regard, a further step is typically implemented wherein a support member, for example member 12 in FIG. 10, is wholly or partially removed from the remainder of the device. There are a variety of techniques which may be utilized for the removal of the support member. In some instances where the support member is metal, chemical etchants such as acids may be employed. In one particular instance, the support member is fabricated from steel, and it is removed by the use of a ferric chloride etchant. In other instances, the support member may be comprised of a body of polymeric material, and may be removed by the use of appropriate solvents. In yet other instances, the support member may be affixed to the substrate by a separable adhesive and may be removed by peeling away, and such removal may be facilitated by the use of a skiving blade, a laser beam, or other such means known in the art.

While the foregoing has described a process in which a substrate is disposed upon a support, it will be apparent that the basic fabrication process may also be used in conjunction with substrates that are not affixed to a support. Such modifications and variations will have utility in particular instances and may be readily implemented by those of skill in the art.

Numerous modifications and variations of the foregoing may be implemented in view of the teaching presented herein. For example, the techniques disclosed herein may be utilized to fabricate large area arrays comprised of a number of interconnected photovoltaic devices. Such interconnections may be in a series, parallel, or mixed series/parallel relationship selected so as to optimize voltage and current output of the module. Also, while the invention has been described primarily with reference to photovoltaic devices, clearly the techniques disclosed herein may be utilized to fabricate other types of semiconductor devices wherein single surface contacts to electrodes are desired in a lightweight or ultra lightweight device. As mentioned above, these other devices can include photoresponsive and photoemissive devices as well as device arrays, circuits, sensors and the like. Also, it is to be understood that it is within the level of skill of one in the art to utilize materials and configurations other than those precisely shown herein.

In view of the foregoing, it is to be understood that the drawings, discussion and description presented herein are illustrative of specific embodiments of the invention but are not meant to be limitations upon the practice thereof. It is the following claims, including all equivalents, which define the scope of the invention.

The invention claimed is:

1. A method for malting a photovoltaic device, said method comprising the steps of:
   providing a substrate;
   depositing a layer of an electrically conductive bottom electrode material on the substrate so as to form a bottom electrode;
   depositing a photovoltaic body in electrical communication with the bottom electrode;
   depositing a layer of a top electrode material in electrical communication with the photovoltaic body so as to form a top electrode; wherein said bottom electrode, top electrode and photovoltaic body cooperate to provide a photovoltaic cell;
   removing a portion of said top electrode and said photovoltaic body so as to form an opening therethrough having a portion of said bottom electrode exposed therein;
   providing an electrically conductive bus bar having a tab portion defined thereupon;
   affixing the first bus bar in electrical communication with said exposed portion of said bottom electrode so that said tab portion is not affixed thereto;
   disposing a body of an electrically insulating material so as to cover said first bus bar;
   disposing a plurality of grid members in electrical communication with said top electrode, said grid members extending onto said insulating body; and
   disposing a second, electrically conductive bus bar upon said insulating body, in electrical communication with said grid members, whereby said second bus bar establishes electrical communication with said top electrode.

2. The method of claim 1, including the further steps of:
   folding said tab portion into a superposed relationship with the second bus bar; and
   disposing a portion of an electrically insulating material between said folded-over tab portion and said second bus bar so as to prevent electrical contact therebetween.

3. The method of claim 2, wherein said insulating material comprises a unitary body which extends onto said tab wherein when said tab is folded in said superposed relationship with said first bus bar, said insulating material is interposed therebetween.

4. The method of claim 1, wherein the step of providing a substrate comprises disposing said substrate on a support body.

5. The method of claim 4, including the further step of removing at least a portion of said support from said substrate.

6. The method of claim 5, wherein said support comprises a body of metal, and said step of removing said support comprises etching away at least a portion of said metal.

7. The method of claim 4, including the further step of disposing a layer of a stress balancing material between said support body and said substrate.

8. The method of claim 1, including the further step of disposing a layer of a protective material onto the top electrode.

9. The method of claim 1, wherein said substrate comprises a body of a polymeric material.

10. The method of claim 9, wherein said polymeric material comprises a layer of a polyimide polymer.

11. The method of claim 9, wherein said layer of polymeric material has a thickness of 0.5 to 2 mil.

12. The method of claim 1, wherein said bottom electrode material comprises a metal.

13. The method of claim 1, wherein said bottom electrode material is a composite body comprised of a layer of silver or a silver alloy, said layer having a layer of a transparent electrically conductive material disposed thereupon.

14. The method of claim 1, wherein said top electrode material comprises a transparent electrically conductive material.

15. The method of claim 14, wherein said transparent electrically conductive material comprises indium tin oxide.

16. The method of claim 1, wherein said photovoltaic body comprises at least one triad of semiconductor layers, said triad comprising a layer of substantially intrinsic semiconductor material interposed between oppositely doped layers of semiconductor material.

17. The method of claim 16, wherein said photovoltaic body comprises a plurality of said triads stacked in an optical and electrical series relationship.

18. The method of claim 1, wherein said photovoltaic body includes at least one layer of a hydrogenated group IV semiconductor alloy.

19. The method of claim 1, wherein said step of removing a portion of the top electrode and photovoltaic body comprises etching said top electrode and photovoltaic body.

20. The method of claim 1 including the further step of removing a portion of said top electrode so as to define a perimeter bounding a photovoltaic cell.

21. The method of claim 1, wherein said insulating material is adhesively affixed to said first bus bar.

22. The method of claim 21, wherein said insulating material comprises a double-sided adhesive tape.

23. The method of claim 1, wherein said grid members comprise electrically conductive wires.

24. The method of claim 23, wherein said wires comprise a core of copper coated with silver.

25. A photovoltaic device made according to the method of claim 1.

* * * * *